(12) United States Patent
Trimberger et al.

(10) Patent No.: US 6,849,951 B1
(45) Date of Patent: Feb. 1, 2005

(54) BYPASS CAPACITOR SOLUTION FOR INTEGRATED CIRCUIT DICE

(75) Inventors: Stephen M. Trimberger, San Jose, CA (US); Austin H. Lesea, Los Gatos, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 10/377,863

(22) Filed: Feb. 28, 2003

(51) Int. Cl.[7] .............................................. H01L 23/52
(52) U.S. Cl. ........................ 257/777; 257/678; 257/734
(58) Field of Search ................................ 257/678–686, 257/734–777

(56) References Cited

U.S. PATENT DOCUMENTS

| | | | |
|---|---|---|---|
| 6,114,221 A | 9/2000 | Tonti et al. | |
| 6,144,225 A | 11/2000 | Lesea | |
| 6,271,059 B1 | 8/2001 | Bertin et al. | |
| 6,368,930 B1 | 4/2002 | Enquist | |
| 6,410,431 B2 | 6/2002 | Bertin et al. | |
| 6,444,560 B1 | 9/2002 | Pogge et al. | |
| 6,653,858 B2 * | 11/2003 | Meier et al. | ................ 326/37 |
| 6,683,781 B2 * | 1/2004 | Ho et al. | ................ 361/301.1 |
| 2002/0064906 A1 | 5/2002 | Enquist | |

OTHER PUBLICATIONS

Kaustav Banerjee, Shukri J. Souri, Pawan Kapur and Krishna C. Saraswat, "3–D ICs: A Novel Chip Design for Improving Deep–Submicrometer Interconnect Performance and Systems–on–Chip Integration," IEEE, May 2001, pp. 602–633, vol. 89., No. 5, available from Center for Integrated Systems, Stanford University, Stanford, CA., 94305.

* cited by examiner

*Primary Examiner*—Nathan J. Flynn
*Assistant Examiner*—Leonardo Andújar
(74) *Attorney, Agent, or Firm*—T. Lester Wallace; Jeanette S. Harms; Lois D. Cartier

(57) ABSTRACT

A die having a bypass capacitor is stacked on another die having an active circuit. The active circuit draws a spike of current, for example, during a switching period of a voltage on its output lead from one digital logic level to another digital logic level. The bypass capacitor provides a portion of the spike of current through a conductive plug that extends from a plate of the bypass capacitor to a power lead of the active circuit. The length of the conductive plug is reduced by extending the conductive plug from the bypass capacitor to the active circuit orthogonally to the planar orientation of the dice. Reducing the length of the conductive plug reduces the resistance and inductance of the conductive plug and, in turn, reduces the drop in voltage between the voltage on the bypass capacitor and the voltage on the power lead of the active circuit.

14 Claims, 3 Drawing Sheets

BYPASS CAPACITOR SOLUTION FOR INTEGRATED CIRCUIT DICE

FIELD OF THE INVENTION

The present invention relates to multi-chip devices, and specifically to circuit configurations and methods for providing bypass capacitors that supply spikes of supply current to associated active circuits.

BACKGROUND OF THE INVENTION

Integrated circuits typically involve active circuits that draw spikes of current from a local power supply line or bus. One example of an active circuit that may draw such a spike of current is a digital logic element disposed on an integrated circuit. The digital logic element has a VCC power lead that is coupled by a power (VCC) supply line or bus to a power VCC terminal or pad of the integrated circuit. If, for example, the digital logic element is disposed in the center of the integrated circuit, then the power supply line can be quite long and may have significant resistance and inductance.

When a signal on an input lead of the digital logic element switches from one digital logic level to another digital logic level, the digital logic element may draw a spike of current from the power supply line. This spike of current can include a crossover current that passes from the VCC power lead of the digital logic element through the digital logic element and to a ground lead of the digital logic element. This spike of current can also include a switching current needed to supply electrical charge to the load of the digital logic element such that the voltage on the output of the digital logic element can transition from one digital logic voltage to another.

If the power supply line had no resistance or inductance, then the spike of current could be supplied to the digital logic element through the supply line without a significant drop in the voltage on the VCC power lead of the digital logic element. However, because some resistance and inductance is inherently associated with the power supply line, the voltage on the VCC power lead of the digital logic element may drop momentarily when the digital logic element switches from one digital logic level to another.

Such a voltage drop can have undesirable consequences. For example, where the signal output from the digital logic element is to switch from a digital logic low to a digital logic high, the voltage on the VCC power lead of the digital logic element might momentarily dip to a level that is not recognized as a digital logic high. This voltage dip can delay the transition of the signal and can cause other problems.

One technique used to prevent undesirable dips in supply voltage to active devices is to provide "bypass capacitors" close to the active devices. When an active device draws a spike of current, much of this current is supplied by a local bypass capacitor, thereby reducing the magnitude of the current spike pulled through the VCC power supply line. By reducing the magnitude of the current spike pulled through the supply line, the magnitude of the associated voltage drop at the power supply lead of the active device is reduced as well.

U.S. Pat. No. 6,144,225 describes a technique whereby an integrated metal plate bypass capacitor is fashioned from the upper layers of metallization above active elements on an integrated circuit. When one of the active elements of the integrated circuit draws a spike of supply current, at least some of that spike of current is provided by the overlying integrated metal plate bypass capacitor. Employing this technique may consume undesirable amounts of metal routing resources in the upper layers of metallization.

U.S. Pat. No. 6,271,059 describes another technique involving a connector that contains active circuits and which may also include decoupling capacitors. Metallized stub terminals laterally disposed with respect to the active circuits and decoupling capacitors on the connector couple the connector to an overlying integrated circuit chip. Due to the metallized stub terminals, the decoupling capacitors are disposed a distance from any active circuits on the overlying integrated circuit that might be receiving bypass current from the connector. This distance may introduce unwanted resistance and/or inductance in the attendant connection from the decoupling capacitor to the integrated circuit.

U.S. Pat. No. 6,410,431 discloses another technique that uses chip-to-chip connectors to mount multiple smaller decoupling capacitors on the front and back surfaces of relatively larger chips. The mounting of multiple smaller decoupling capacitors in this fashion is seen to be somewhat impractical.

An improved and practical circuit configuration and method is sought for more directly providing bypass current to the active circuits that need the bypass current.

SUMMARY OF THE INVENTION

A die assembly includes a first die upon which a second die is stacked. The first die includes an active circuit. The active circuit can be a digital and/or analog circuit. The second die includes an integrated bypass capacitor. One of two plates of the bypass capacitor on the second die is coupled to a power supply lead of the active circuit on the first die. A second plate of the bypass capacitor on the second die is coupled to a ground lead of the active circuit on the first die.

In one embodiment, theactive circuit is a digital circuit. The digital circuit draws a spike of current during a switching period of a voltage on its output lead from a first digital logic level to a second digital logic level. A portion of this spike of current is provided by the bypass capacitor to the digital circuit through a conductive plug that extends from the bypass capacitor on the second die to the power supply lead of the digital circuit on the first die. The length of this conductive plug is reduced by extending the conductive plug in a direction orthogonal to the face side of the second die from the bypass capacitor on the second die down to the digital circuit on the first die. Reducing the length of the conductive plug in this fashion reduces the resistance and/or inductance of the conductive plug and, in turn, reduces the magnitude of an associated voltage drop that may have otherwise appeared on the power supply lead of the digital circuit.

Methods are disclosed for making the die assembly. In one embodiment, the second die is thinned (for example, by chemical mechanical polishing). The thinned second die is then stacked on the first die in a face-to-face relation with respect to the first die. In a variation on this embodiment, the second die is stacked on the first die before being thinned, and thinned after being stacked. A via is then etched into the backside of the thinned second die and the via is filled with metal such that a conductive plug is formed that extends from one of the plates of the integrated capacitor on the second die down to a power supply lead of the active circuit on the underlying first die. In operation, when the active circuit on the first die switches and draws a spike of current through its power supply lead, at least a portion of this spike of current is supplied through the conductive plug from the bypass capacitor on the second die.

Additional novel aspects and embodiments are described in the detailed description below. The claims, and not this summary, define the scope of the invention.

BRIEF DESCRIPTION OF THE DRAWINGS

The accompanying drawings, where like numerals indicate like components, illustrate embodiments of the invention.

DETAILED DESCRIPTION OF THE DRAWINGS

Figure 1:
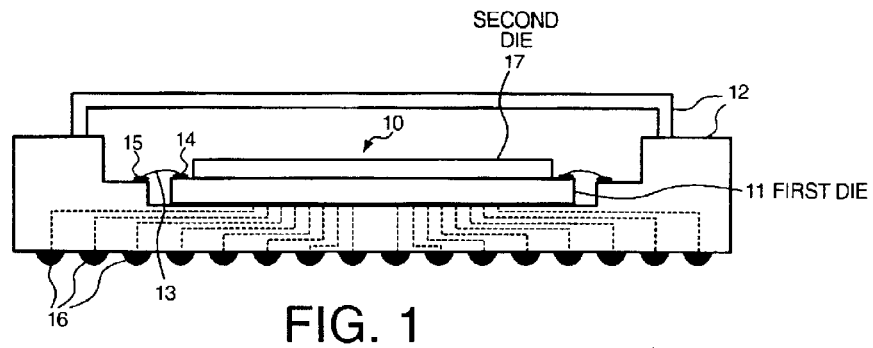
FIG. 1 is a simplified cross sectional diagram of a die assembly in a ceramic package in accordance with one embodiment of the present invention.

FIG. 1 is a simplified cross sectional diagram of a die assembly 10 in accordance with a first embodiment of the present invention. In this example, a first die 11 is mounted in one exemplary package, a ceramic package 12. The present invention is usable with many types of packages. This package is described here to illustrate one possible configuration.

First die 11 contains circuitry disposed on a silicon substrate. Wire bonds connect the circuitry on first die 11 to the ceramic package 12. Wire bond 14 extends from a bonding pad 14 on first die 11 to a bonding area 15 on ceramic package 12. Input leads and output leads of the circuitry are coupled through the ceramic package to a printed circuit board or another electronic device via solder bumps 16 on the bottom surface of the ceramic package 12.

Ceramic package 12 also contains a second die 17. Second die is stacked on top of first die 11 such that the face side of first die 11 faces the face side of second die 17. The term "face side" used here denotes the side of the die that receives the bulk of semiconductor processing such that circuitry is fabricated on that face side of the die.

Figure 2:
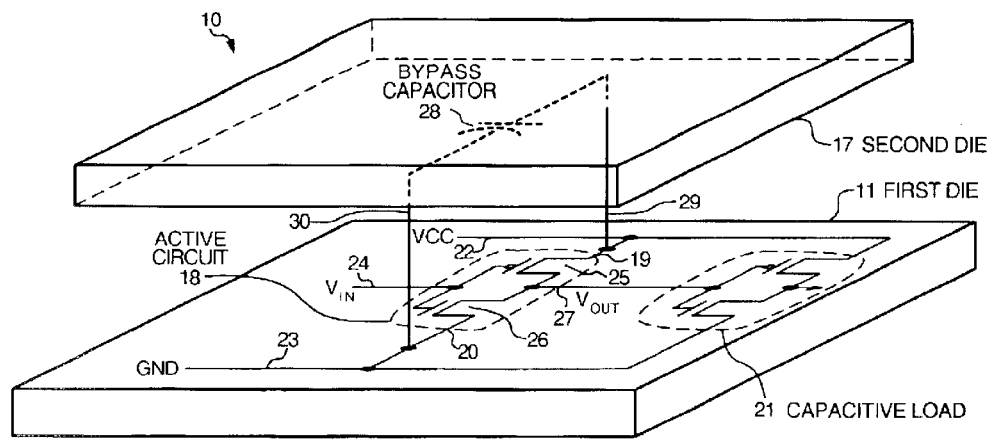
FIG. 2 is a simplified perspective schematic diagram of two dice of the die assembly of FIG. 1.

FIG. 2 is a simplified perspective schematic diagram of one example of first die 11 and second die 17 of FIG. 1. Circuitry is shown on the face side of first die 11. This circuitry includes an active circuit 18, a power supply conductor or line 22, a ground conductor or line 23, and a capacitive load 21. The capacitive load here is the input capacitance of an inverter. Active circuit 18 receives power from power supply conductor 22 through power supply lead 19. Active circuit 18 is coupled to ground conductor 23 through ground lead 20. In this example, active circuit 18 is a complementary metal oxide semiconductor (CMOS) inverter having a signal input lead 24, a P channel pullup transistor 25, an N channel pulldown transistor 26, and a signal output lead 27.

FIG. 2 also shows second die 17 having an integrated bypass capacitor 28. Bypass capacitor 28 is coupled to power supply conductor or line 22 by a first conductive plug 29. First conductive plug 29 is represented in FIG. 2 as a vertically extending line. Bypass capacitor 28 is also coupled to ground line or conductor 23 by a second conductive plug 30. Although second die 17 is shown detached above first die 11 for ease of illustration, it is understood that second die 17 is in physical contact with first die 11.

Figure 3:
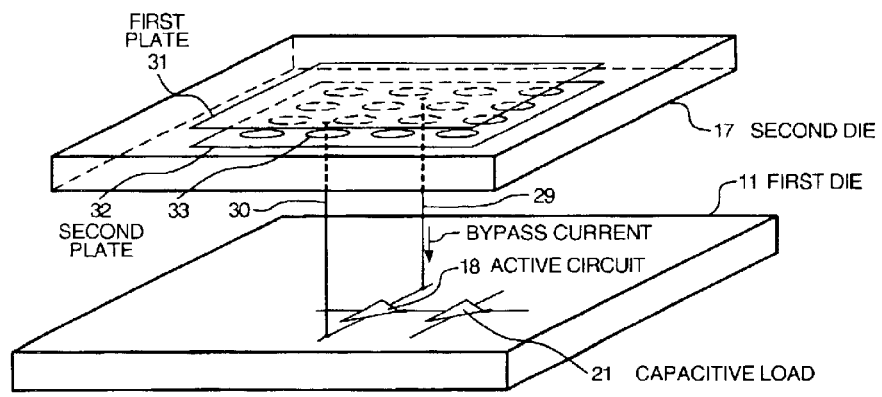
FIG. 3 is a simplified perspective schematic diagram of the two dice of the die assembly of FIG. 1 showing the plates of a bypass capacitor.

FIG. 3 shows bypass capacitor 28 in more detail. In this embodiment, bypass capacitor 28 includes a first planar metal plate 31 and a second planar metal plate 32. First plate 31 is situated above and parallel to second plate 32. Second plate 32 contains multiple openings, such as opening 33. In this embodiment, there are thousands of openings in second plate 32.

Bypass capacitor 28 is large and extends over multiple active circuits on the first die 11 other than active circuit 18. The lower second plate 32 is coupled to the source (the supply voltage lead) of P channel pullup transistor 25 (as shown in FIG. 2) through first conductive plug 29. The upper first plate 31 is coupled to the source (the ground lead) of N channel pulldown transistor 26 through second conductive plug 30. Conductive plug 30 is substantially orthogonal to first plate 31 and passes through opening 33 in second plate 32. Active circuit 18 has a lateral boundary. Conductive plugs 29 and 30 are disposed entirely within the lateral boundary of active circuit 18 in order to limit the length of these conductive plugs and thereby reduce their resistance and/or inductance.

The operation of this embodiment is illustrated in FIG. 2 by a simplified circuit diagram of active circuit 18, capacitive load 21 and bypass capacitor 28. At a point in the operation, capacitive load 21 is discharged such that zero volts is present on the gates of the transistors making up the capacitive load. Voltage Vin on signal input lead 24 is a digital logic high, for example, 3.3 volts. Thus, P channel transistor 25 is nonconductive, N channel transistor 26 is conductive. Bypass capacitor 28 is in a charge state such that the supply voltage is present between plates 31 and 32 of the bypass capacitor.

During operation in this example, the voltage on signal input lead 24 of active circuit 18 then switches from a digital logic high to a digital logic low, i.e., zero voltage of ground potential. P channel transistor 25 becomes conductive and N channel transistor 26 becomes nonconductive. Capacitive load 21 charges as current flows from VCC power supply conductor 22, through conductive P channel transistor 25, and to capacitive load 21.

Transistors 25 and 26 do not turn on and off instantaneously, however. For a short period of time after the voltage Vin switches, both transistors 25 and 26 are conductive to some extent. During this short period of time, active circuit 18 draws a spike of current as current passes from the VCC power supply conductor 22, through power supply lead 19, through P channel transistor 25, through N channel transistor 26, through ground lead 20 to ground conductor 23. The current that passes through active circuit 18 during the period when both P channel transistor 25 and N channel transistor 26 are both somewhat conductive can be referred to as crossover current. During the short period of time after the voltage Vin switches, a switching current also flows from power supply conductor 22, through P channel transistor 25 and to capacitive load 21 as capacitive load 21 charges.

The spike of current is supplied through conductors 22 and 23. Because some resistance and inductance is inherently associated with conductors 22 and 23, the voltage on the source of P channel transistor 25 drops as active circuit 18 draws the spike of current. The drop in voltage is reduced, however, by current that is supplied from bypass capacitor 28 through a current path provided by conductive plug 29. The portion of the spike of current that is supplied by bypass capacitor 28 is represented in FIG. 3 by an arrow that is parallel to conductive plug 29. 'Even with the current supplied by bypass capacitor 28, the voltage on the source of P channel transistor 25 still drops somewhat as the spike of current is drawn because conductive plug 29, just as power supply lead 19, exhibits some resistance and conductance. In accordance with this embodiment, the amount of voltage drop on the source of P channel transistor 25 is reduced by reducing the length of conductive plug 29 over which the current flows from bypass capacitor 28 to P channel transistor 25. Conductive plug 29 extends in a direction orthogonal to the face side of first die 11, thereby providing a more direct path from a bypass capacitor one die to the active circuit on the other die. The result is a shortened conductive path from the bypass capacitor to the active circuit needing the bypass current. Thus, a technique is disclosed that avoids using long-distance interconnects from the interior to the perimeter of first die 11 for the purpose of connecting circuitry on first die 11 to bypass capacitors on other die.

Figure 4:
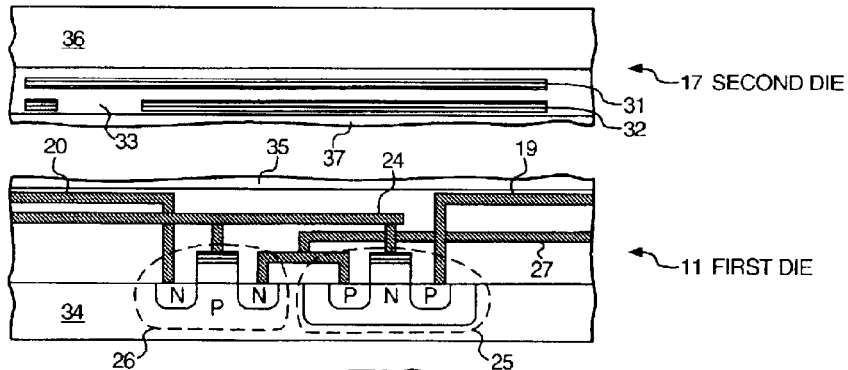
FIG. 4 is a simplified cross-sectional diagram of two dice showing an initial step for providing a bypass capacitor in a die assembly.

FIG. 4 is a simplified cross-sectional diagram of first die 11 and second die 17 showing P channel transistor 25 and N channel transistor 26. FIG. 4 illustrates an initial step in a method for providing a bypass capacitor in a die assembly. In the initial step, first die 11 and second die 17 have not yet been brought into physical contact. Circuitry on the face sides of first die 11 and second die 17 is fabricated separately. Semiconductor processing is performed on top of a substrate layer 34 of first die 11, and an insulating passivation layer 35 covers the face side of first die 11. Semiconductor processing is performed on top of a substrate layer 36 of second die 17, and an insulating passivation layer 37 covers the face side of second die 17. Substrate layer 36 is then thinned, for example by chemical mechanical polishing the back side of second die 17. First die 11 and thinned second die 17 are then brought face-to-face and stacked. First die 11 and thinned second die 17 may be held together without adhesive by weak covalent forces.

Figure 5:
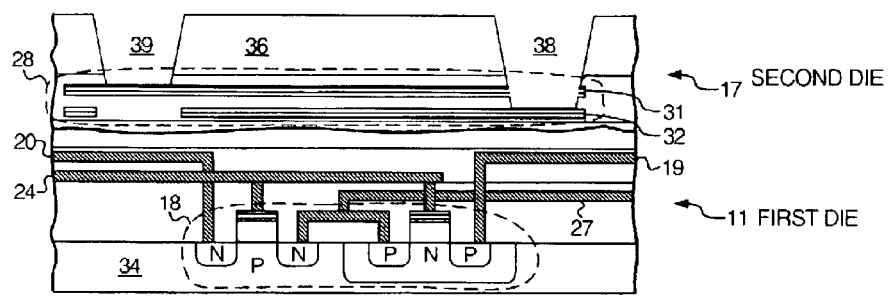
FIG. 5 shows the dice of FIG. 4 stacked face-to-face with wide vias etched in the top die.

FIG. 5 shows a subsequent step in which first die 11 and second die 17 have been stacked face-to-face. The technique for providing a bypass capacitor in a die assembly involves coupling bypass capacitor 28 to active circuit 18 through a short conductive plug. Although in the perspective of FIG. 2 conductive plug 29 is shown as being longer than power supply lead 19, conductive plug 29 is in fact much shorter. Conductive plug 29 extends orthogonally from second plate 32 to power supply lead 19 at the source of P channel transistor 25. In FIG. 5, a first wide via 38 is etched into second die 17 from the back side of substrate 36 to expose a surface of second plate 32. Similarly, a second wide via 39 is etched into the backside of substrate 36 to expose a surface of first plate 31. Both first plate 31 and second plate 32 are therefore exposed.

Figure 6:
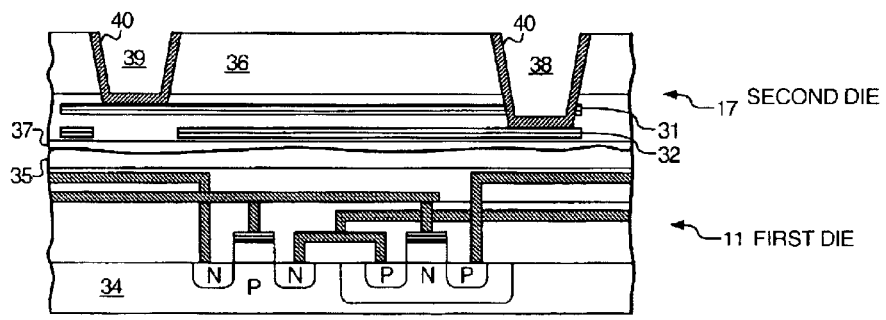
FIG. 6 shows the dice of FIG. 5 with a layer of insulating material in the wide vias.

A layer of insulating material 40 is then deposited over the backside of second die 17 such that the inside surfaces of first wide via 38 and second wide via 39 are coated with insulating material. The portion of the layer of insulating material deposited on the backside of second die 17 may be optionally removed, for example in a chemical mechanical polishing step. The resulting structure is illustrated in FIG. 6.

Figure 7:
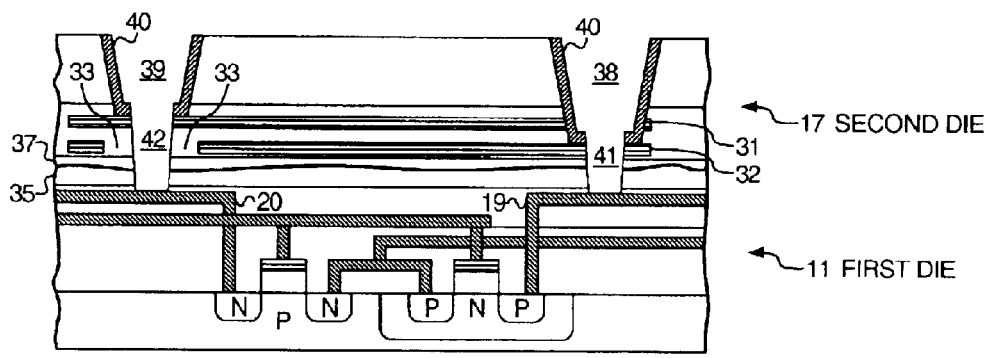
FIG. 7 shows the dice of FIG. 6 with smaller geometry holes etched through the bottom of the wide vias.

FIG. 7 shows a subsequent step wherein smaller geometry vias 41 and 42 are etched down to expose portions of underlying power supply lead 19 and ground lead 20, respectively. Small geometry via 41 is formed by etching through the insulating layer 40 in the bottom of via 28, down through second plate 32, down through passivation layer 37, down through passivation layer 35, and to power supply lead 19. At the point where small geometry via 41 reaches the level of power supply lead 19, power supply lead 19 can be widened to form a pad. Small geometry via 41 has substantially vertical sides and is oriented orthogonally to second plate 32.

Small geometry via 42 is formed by etching through insulating layer 40 in the bottom of via 39, down through first plate 31, through opening 33 in second plate 32, down through passivation layer 37, down through passivation layer 35, and to ground lead 20. Small geometry via 42 has substantially vertical sides and is oriented orthogonally to first plate 31. Although small geometry via 42 passes through the plane of second plate 32, small geometry via 42 is not etched through second plate 32. Instead, small geometry via 42 passes through opening 33. At the point where small geometry via 42 reaches the level of ground lead 20, ground lead 20 can be widened to form a pad.

Next, metal is deposited into wide via 38 and vertically-sided via 41, as well as into wide via 39 and vertically-sided via 42. Excess metal deposited onto the backside of second die 17 is then removed using chemical mechanical polishing. The resulting structure is shown in FIG. 8.

Figure 8:
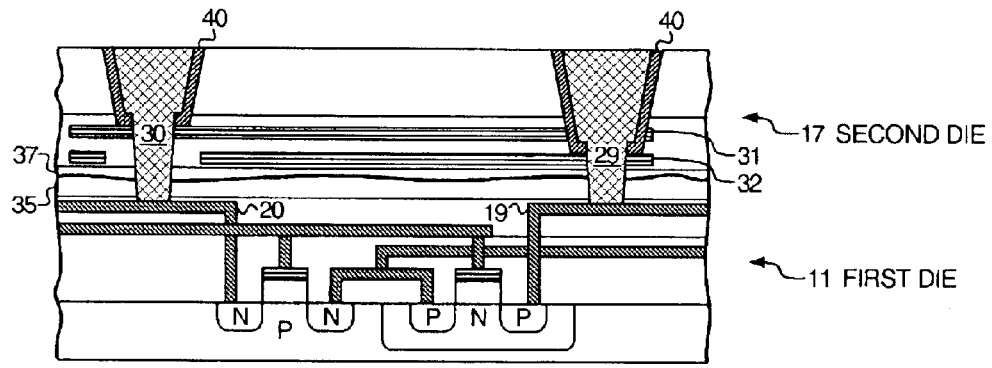
FIG. 8 shows the dice of FIG. 7 with metal deposited in the wide vias and smaller geometry vias to form conductive plugs.

The structure of FIG. 8 includes a first conductive plug 29 disposed in wide via 38 and vertically-sided via 41. This conductive plug 29 couples second plate 32 of the bypass capacitor to power supply lead 19 at the underlying active circuit. Conductive plug 29 is insulated from first plate 31 of the bypass capacitor by a portion of insulating layer 40 on the side wall of wide via 38.

The structure also includes a second conductive plug 30 disposed in wide via 39 and vertically-sided via 42. This conductive plug 30 couples first plate 31 of the bypass capacitor to ground lead 20 at the underlying active circuit. Conductive plug 30 is insulated from second plate 32 of the bypass capacitor by insulating material disposed in the opening 33 in second plate 32.

The above-described technique for providing a bypass capacitor in a die assembly allows first die 11 and second die 17 to be fabricated in different semiconductor processes. Second die 17 containing bypass capacitor 28 can be fabricated using a larger geometry, older and less expensive process than the relatively advanced process by which the circuitry on first die 11 is fabricated.

For additional information on how to couple dice together and how to fabricate conductive plugs in accordance with embodiments of the present invention, see: 1) U.S. Pat. No. 6,271,059 issued to Bertin et al., 2) U.S. Pat. No. 6,114,221 issued to Tonti et al., 3) U.S. Pat. No. 6,410,431 issued to Bertin et al., 4) U.S. Pat. No. 6,444,560 issued to Pogge et al., 5) Published U.S. patent application Ser. No. US2002/0064906 by Enquist, and 6) U.S. Pat. No. 6,368,930 issued to Enquist. The entirety of the subject matter of each of these patent documents is hereby incorporated by reference.

Although the technique of providing conductive plugs shown in FIGS. 4 through 8 is set forth here for purposes of illustration, there are many other ways of coupling bypass capacitors on a second die to an active circuit on a first die that are suitable for coupling together the two dice of the die assembly of the present invention. First die 11 and second die 17 need not be mounted in a face-to-face relation. Vias do not have to be etched all the way through second die 17. For example, in one embodiment, conductive micropads are placed on both the first die and the second die so that when the two dice are stacked together, corresponding micropads on the two dice come into contact and couple the bypass capacitor on the second die to active circuits on the first die. The particular conductive plug technique of FIGS. 4 through 8 is presented for illustrative purposes only. For additional information on other ways of coupling an active circuit on one die to a circuit on an overlying die, on micropad structures and alignment structures, see U.S. Pat. No. 6,271,059, issued Aug. 2, 2001, to Bertin et al., U.S. Pat. No. 6,410,431, issued Jun. 25, 2002, to Bertin et al. (the entirety of the subject matter of both of these patents is hereby incorporated by reference).

Although the present invention is described in connection with certain specific embodiments for instructional purposes, the present invention is not limited thereto. Bypass capacitor 28 can have more than two plates. Bypass capacitor can be a metal plate capacitor and/or can employ the junction capacitance of a back-biased PN junction, or the gate capacitance of a field effect semiconductor structure. Although conductive plug 30 in the above described embodiment passes through opening 33 and is not insulated by insulating layer 40 from second plate 32, this need not be the case. In another embodiment, for example, second plate 32 does not have openings for conductive plugs to pass through, and vertically-sided via 42 exposes a portion of second plate 32. The inside surface of via 42 is coated with an insulating layer that insulates conductive plug 30 from second plate 32.

Although first die 11 may, in some embodiments, be a field programmable gate array, die 11 can be any type of integrated circuit that includes active circuits. Techniques set forth above are not limited to use in field programmable gate arrays. The active circuit to which the bypass capacitor supplies a portion of a spike of current in accordance with embodiments of the present invention may be an analog circuit, or a digital circuit, or any other type of circuit whose performance can be enhanced by coupling it to a bypass capacitor.

Although the invention is described in connection with solving problems caused by current spikes being drawn from a supply voltage line, the invention applies equally to solving ground bounce problems caused by surges of current being dumped into ground conductors. The conductive plug that supplies the current from the bypass capacitor to the active circuit need not be a monolithic plug, but rather can involve two plug portions, each plug portion having a micropad. When the two dice are brought together, the micropad of one plug portion on one die makes electrical contact with the micropad of the other plug portion on the other die. Also, although the figures such as FIG. 2 show only a single capacitor in the second die, a commercial device would include thousands or millions of these capacitors. Also, although FIG. 2 shows the capacitor bypassing a single inverter power supply, it is likely that bypass capacitors will be provided for larger circuits comprising hundreds or thousands of transistors with multiple logic gates, rather than provided for the power supply connection of every gate. Further, although the figures show one capacitor bypassing a single gate, one capacitor may have leads for bypassing many gates. Accordingly, various modifications, adaptations, and combinations of various features of the described embodiments can be practiced without departing from the scope of the invention as set forth in the following claims.

What is claimed is:

1. A die assembly comprising:
   a first die including an active circuit, the active circuit including a power supply lead and a ground lead;
   a second die coupled to the first die in a stacked relation, the second die including a bypass capacitor, the bypass capacitor including a first plate and a second plate, wherein the first plate extends in a first plane and the second plate extends in a second plane;
   a first conductive plug extending substantially orthogonally to the first plane, the second plate being coupled to the power supply lead of the active circuit by the first conductive plug; and
   a second conductive plug, the second conductive plug extending substantially orthogonally to the first plane, the first plate being coupled to the ground lead of the active circuit by the second conductive plug.

2. The die assembly of claim 1, wherein the active circuit is taken from the group consisting of: an analog circuit and a digital circuit.

3. The die assembly of claim 1, wherein the bypass capacitor further includes a third plate.

4. The die assembly of claim 1, wherein the power supply lead of the active circuit draws a current and wherein the bypass capacitor supplies at least some of the current.

5. The die assembly of claim 1, wherein the active circuit has lateral boundaries, and wherein the first conductive plug is disposed within the lateral boundaries of the active circuit.

6. The die assembly of claim 1, wherein the bypass capacitor supplies at least some of the current to the power supply lead through the first conductive plug.

7. The die assembly of claim 1, wherein the active circuit has lateral boundaries, and wherein a spike of current flows through a current path from the bypass capacitor on the second die to the active circuit on the first die, the current path being disposed within the lateral boundaries of the active circuit.

8. A die assembly, comprising:
   a first die including an active circuit and having a face side, said active circuit including a first power lead, a second power lead, and an output lead;
   a second die coupled to the first die in a stacked relation, the second die including a bypass capacitor, said bypass capacitor including a first plate and a second plate;
   a first conductive plug coupled to the second plate and extending substantially orthogonally to the face side of the first die, and contacting the first power lead at the face side of the first die wherein, a spike of current flows from the second plate through the first conductive plug to the first power lead during a switching period of a voltage on the output lead from a first digital logic level to a second digital logic level; and
   a second conductive plug coupled to the first plate and extending substantially orthogonally to the face side of the first die, and contacting the second power lead at the face side of the first die.

9. The die assembly of claim 8, wherein the first plate has lateral boundaries, the second plate has lateral boundaries and the active circuit has lateral boundaries, and wherein the lateral boundaries of the active circuit are totally within the lateral boundaries of the first plate and within the lateral boundaries of the second plate.

10. The die assembly of claim 8, wherein the first conductive plug comprises a first plug portion and a second plug portion, the first plug portion making electrical contact with the second plug portion such that the spike of current flows from the second plate, through the second plug portion, through the first plug portion, and to the power lead of the active circuit.

11. The die assembly of claim 8, wherein the spike of current flows through a micropad.

12. A die assembly, comprising:
- a first die including an active circuit, the active circuit including an output lead;
- a second die coupled to the first die in a stacked relation, the second die including a bypass capacitor; and
- means for providing a portion of a spike of current from the bypass capacitor to the active circuit during a period when the active circuit draws the spike of current, wherein the means for providing includes:
  - a first conductive plug for connecting a first plate of the bypass capacitor and a first portion of the active circuit; and
  - a second conductive plug for connecting a second plate of the bypass capacitor and a second portion of the active circuit.

13. The die assembly of claim 12, wherein the second plate includes a hole and the first conductive plug passes through the hole.

14. The die assembly of claim 12, wherein at least one of the first and second conductive plugs includes a first plug portion and a second plug portion.

\* \* \* \* \*